United States Patent [19]

Gerlach

[11] Patent Number: 4,797,807
[45] Date of Patent: Jan. 10, 1989

[54] MULTIPLE CHANNEL FAST ORTHOGONALIZATION NETWORK

[75] Inventor: Karl Gerlach, Dunkirk, Md.

[73] Assignee: The United States of America as represented by the Secretary of the Navy, Washington, D.C.

[21] Appl. No.: 761,648

[22] Filed: Aug. 2, 1985

[51] Int. Cl.[4] ............................................. G06F 7/38
[52] U.S. Cl. ........................... 364/724.07; 364/724.01; 364/724.19
[58] Field of Search ............................ 370/18, 19, 21; 364/724, 728

[56] References Cited

U.S. PATENT DOCUMENTS

| | | | |
|---|---|---|---|
| 3,678,204 | 7/1972 | Harmuth | 370/21 |
| 4,190,895 | 2/1980 | Davis . | |
| 4,489,392 | 12/1984 | Lewis | 364/724 |
| 4,542,515 | 9/1985 | Gutleber | 370/18 |
| 4,578,676 | 3/1986 | Harrison, Jr. | 342/160 |
| 4,606,054 | 8/1986 | Amitay et al. | 375/102 |
| 4,621,355 | 11/1986 | Hirosaki et al. | 370/18 |

Primary Examiner—Gary V. Harkcom
Assistant Examiner—Dale M. Shaw
Attorney, Agent, or Firm—Thomas E. McDonnell; Ansel M. Schwartz

[57] ABSTRACT

A method for orthogonalizing inputs with respect to each other. The method comprises the steps of: generating a root structure of N inputs having input order 1 to N, where $2^{m-1} < N \leq 2^m$ and m is an integer $\geq 1$; inverting the order of the root structure to generate an inverted root structure having input order N to 1; partially orthogonalizing the root structure and the inverted root structure in associated respective decorrelation circuits to remove inputs common to their first $2^{m-I}$ inputs where $I=1$; splitting off two substructures from the root structure, where the first substructure has input order 1 to $2^{m-I}$ and the second substructure has input order $2^{m-I}$ to 1, where $I=1$; splitting off two substructures from the inverted root structure, where the first substructure has input order $2^m$ to $2^{m-I}$ and the second substructure has input order $2^{m-I}$ to $2^m$, where $I=1$; partially orthogonalizing each of the substructures in associated respective decorrelation circuits to remove inputs common to their first $2^{m-I}$ inputs, where $I=2$; and repeating the splitting off steps and the subsequent partially orthogonalizing step until only one input remains, where for each repetition the substructures that are split-off are treated as new root structure and new inverted root structure, and the value identified for I in each step is increased by 1.

5 Claims, 2 Drawing Sheets

MULTIPLE CHANNEL FAST ORTHOGONALIZATION NETWORK

BACKGROUND OF THE INVENTION

The present invention relates to the decorrelation of multiple input channels by direct adaptive filtering of the multiple input channels using Gram-Schmidt orthogonalization. More specifically, the present invention relates to multiple channel adaptive filtering using a fast orthogonalization network.

There is a great interest and need to orthogonalize or decorrelate every input channel of a multiple channel input system with respect to the other input channels of the system. By orthogonalizing the input channels of the system with respect to each other, the input channels are made independent of each other. Great advantages result from channel independence. Every channel only carries information it is supposed to; the channel does not possess any information that is supposed to be carried by another channel. Consequently no cross-correlations exist in the channel that have to be considered during manipulation of the information in the channel, thus allowing for simpler and less expensive circuits. Moreover, greater accuracy concerning the information a channel is carrying is achieved.

In this simplest case, two channels of complex valued data $X_1$ and $X_2$ form an output channel Y which is decorrelated with $X_2$ when $$\overline{YX_2^*}=0 \tag{1}$$

where the overbar denotes the expected value and * denotes the complex conjugate. This can be accomplished by letting $$Y = X_1 - WX_2 \tag{2}$$

and finding a constant weight, w, such that equation 1 is satisfied. By substituting equation 2 into equation 1 and solving for w, it is found that $$w = \frac{\overline{X_1 X_2^*}}{|X_2|^2} \tag{3}$$

where $|.|$ denotes the complex magnitude function. FIG. 1 represents a decorrelation processor DP for the case of 2 inputs $X_1$ and $X_2$.

A more general case is when there exists N channels of complex valued data: $X_1, X_2, \ldots, X_N$. To form an output channel, Y, which is decorrelated with $X_2, X_3, \ldots, X_n$; where $$Y = X_1 - w_2 X_2 - W_3 X_3 - \ldots - W_n X_n. \tag{4}$$

The weights $n=2, 3, \ldots, N$ must be determined such that $$\overline{YX^*_n}=0, n=2, 3, \ldots, N. \tag{5}$$

A weight vector is defined where $w=(w_1, w_2, \ldots, w_N)^T$.

Here $w_1 = 1$ and T represents the vector transpose. w is then the solution of the following vector equation:

$$R_{xx}w = \mu \begin{bmatrix} 1 \\ 0 \\ \cdot \\ \cdot \\ \cdot \\ 0 \end{bmatrix} \tag{6}$$

where $R_{xx}$ is the $N \times N$ convariance matrix of the input channels, i.e., $$R_{xx}=E(X^* X^T) \tag{7}$$

where E( ) denotes the expected value and $X=(X_1, X_2, \ldots, X_N)^T$. The constant $\mu$ is not arbitrary but chosen so that $w_1 = 1$.

From equation 6 it is seen that the decorrelator could be implemented by taking data samples, forming a sample covariance matrix as implied by equation 7, solving equation 6 for the weights, and applying these weights to the input channels.

Another implementation of the decorrelation process for N inputs that has the advantage of not requiring the difficult calculation of a covariance matrix is known as the Gram-Schmidt (GS) decomposition (sometimes called the Adaptive Lattice Filter), as illustrated in FIG. 2, which uses the basic two-input DP as a building block. An adaptive filter is defined to be a filter that bases its own design (its internal adjustment settings) upon estimated statistical characteristics of the input and output signals. GS decomposition decorrelates the inputs one at a time from the other inputs using the basic two-input DP. For example as seen in FIG. 2, in the first stage or level of decomposition, $X_N$ is decorrelated with $X_1, X_2, \ldots, X_{N-1}$. Next, the output channel which results from decorrelating $X_N$ with $X_{N-1}$ is decorrelated with the other outputs of the first level of DPs. The decomposition proceeds as seen in FIG. 2 until a final output channel is generated. This output channel is totally decorrelated with the input: $X_2, X_3, \ldots, X_N$. Note that the GS decomposition is not unique; i.e., the order in which $X_2, X_3, \ldots, X_N$ are decorrelated from $X_1$ is arbitrary.

For N channels, the total number of DPs needed for GS decomposition is $0.5N(N-1)$. Hence, this number of decorrelation weights must be computed. For a digital implementation, these weights are determined sequentially. First, the first level weights are estimated after which the output data for the first level are calculated. These output data are used as inputs to the second level from which the second level weights can be calculated. The output data of the second level are generated by using these weights and the second level input data. The process continues until the $(N-1)$th level weight and outputs are calculated.

For notational purposes, the channel input appearing on the right-hand side of the DP as seen in FIG. 1, is defined as being the input which is decorrelated with the channel appearing on the left-hand side. For the multiple channel case, all inputs appearing to the right of the far left input will be decorrelated from this input.

The problem with the GS decomposition is that it requires as many GS decomposition circuits as channels to be decorrelated at a given time.

SUMMARY OF THE INVENTION

Accordingly, one object of the present invention is to provide faster multiple channel adaptive filtering by using a Gram-Schmidt decomposition with a fast orthogonalization.

Another object of the present invention is to reduce the necessary circuitry to decorrelate a pre-determined number of channels at a given time by taking advantage of the redundancy in Gram-Schmidt decomposition.

These and other objects of the present invention can be achieved by a method for orthogonalizing inputs with respect to each other comprising the steps of:

generating a root structure of N inputs having input order 1; to N where $2^{m-1} < N \leq 2^m$ and m is an integer $\geq 1$ inverting the order of the root structure to generate an inverted root structure having input order N to 1; partially orthogonalizing the root structure and the inverted root structure in associated respective decorrelation circuits to remove inputs common to their first $2^{m-I}$ inputs, where I=1; splitting off two substructures from the root structure where the first substructure has input order 1 to $2^{m-I}$ and the second substructure has input order $2^{m-I}$ to 1, where I=1; splitting off two substructures from the inverted root 32B structure, where the first substructure has input order $2^m$ to $2^{m-I}$ and the second substructure has input order $2^{m-I}$ to $2^m$, where I=1; partially orthogonalizing each of the substructures in associated respective decorrelation circuits to remove inputs common to their first $2^{m-I}$ inputs, where I equals 2; and repeating the splitting off steps and the subsequent partially orthogonalizing step until only one input remains, where for each repetition the substructures that are split-off are treated as a new root structure and a new inverted root structure and the value identified for I in each step is increased by 1.

This technique can be generalized to $2^{m-1} < N < 2^m$ (i.e. $N \neq 2^m$), by first generating the structures for $2^m$ inputs and then deleting that circuitry associated with the last $2^m - N$ inputs.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 3:
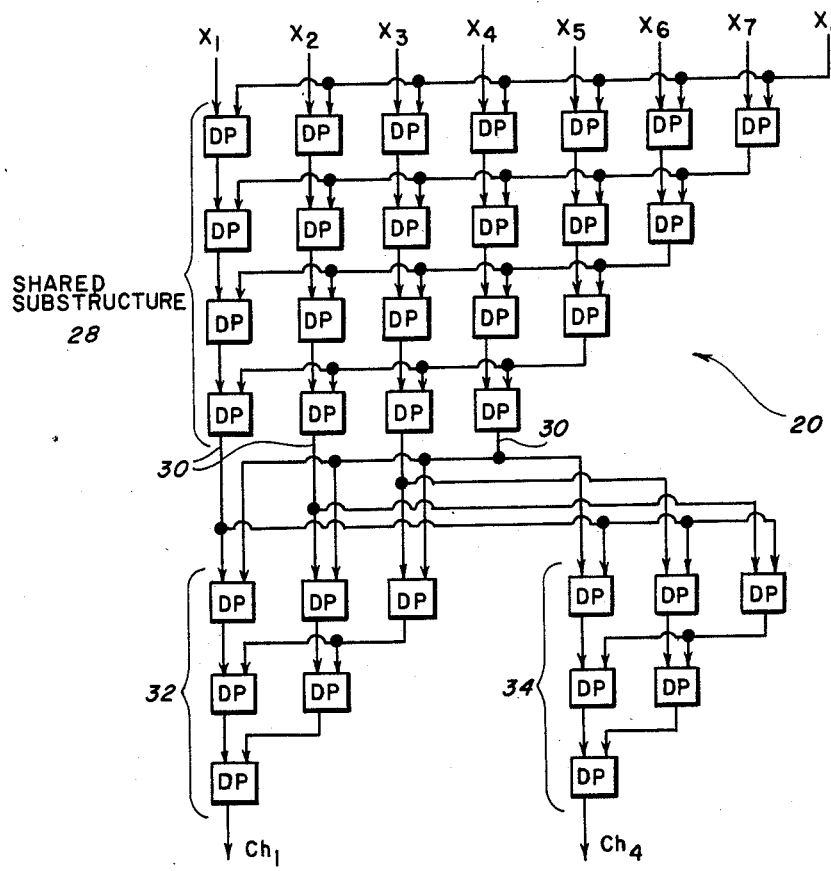
FIG. 3. is a schematic drawing of substructure sharing of a Fast Orthogonalization Network.

Referring now to the drawings, wherein like reference numerals designate identical or corresponding parts throughout the several views, and more particularly to FIG. 3 thereof, there is shown a fast orthogonalization network 20 comprised of inputs $X_1, X_2 \ldots X_8$ and decorrelation processors (DP). The inputs $X_1, X_2 \ldots X_8$ are fed into the decorrelation processors and are piecewise decorrelated with respect to the common inputs of the channels $ch_1$ and $ch_4$ to be decorrelated.

Structure 28 performs the partial orthogonalization that decorrelates the common inputs with regard to the channels to be decorrelated. Substructures 32 and 34 are split off from structure 28 and partially orthogonalize their respective common inputs to form channels $Ch_1$ and $Ch_4$. The substructure 34 has the inverted order of inputs that substructure 32 has. Inputs 30 from structure 28 feed into substructures 32 and 34.

Figure 2:
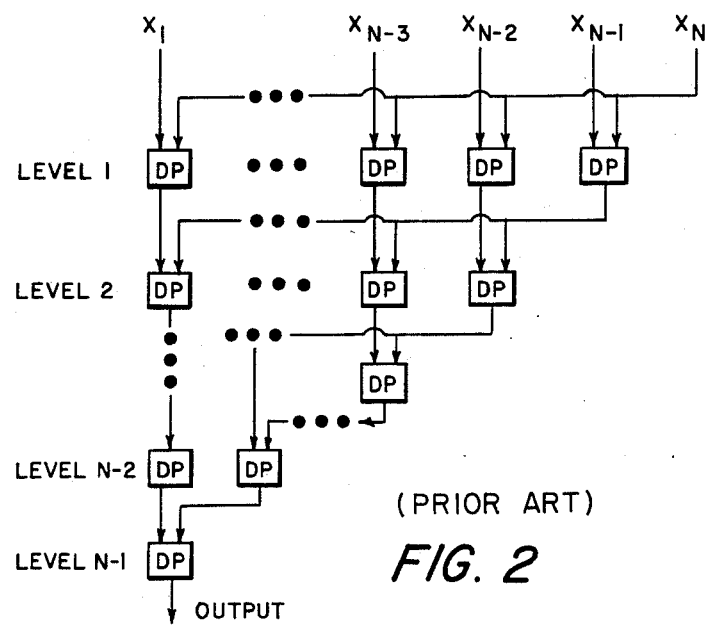
FIG. 2 is a schematic drawing of an N-channel decorrelator.

A more complete explanation of the FON is as follows. To this end the following notation is introduced. A single channel decorrelator is represented as $$CH_1 = [X_1, X_2, X_3, \ldots, X_N]$$

where $X_2, X_3, \ldots X_N$ are decorrelated from $X_1$ and $X_N$ is decorrelated first, $X_{N-1}$ is decorrelated second, and so on. FIG. 2 shows the structure of the correlator. The channel variable, $Ch_1$, references this structure to channel 1 or the $X_1$ channel. The $X_n$, $n=1, 2, \ldots, N$ will be called the elements of the structure.

Numerical efficiency of the algorithm to be presented is achieved by taking advantage of redundancies that can occur for two different decorrelator structures. For example, let there be eight channels. Channels 1 and 4 can be generated as follows:

$$Ch_1 = [X_1, X_2, X_3, X_4, X_5, X_6, X_7, X_8]$$

$$Ch_4 = [X_4, X_3, X_2, X_1, X_5, X_6, X_7, X_8].$$

Note that $Ch_1$ and $Ch_4$ have the same four input channels at the far right. In the actual implementation, the substructure associated with these four rightmost channels can be shared by $Ch_1$ and $Ch_4$ as illustrated in FIG. 3. In fact, anytime two channels have exactly the same far-right channels as indicated by the decorrelator structure, the substructure associated with these far-right elements can be shared in the implementation process.

In the process of the FON the four rightmost channels shared by $Ch_1$ and $Ch_4$ are partially orthogonalized or decorrelated with respect to the four leftmost channels. The outputs from the shared substructure number are then fed into two distinct decorrelator structures that are of the prior art Gram-Schmidt orthogonalizational design to achieve decorrelated channels $Ch_1$ and $Ch_4$.

For convenience, let $N=2^m$. In general we can configure $2^{m-1}$ output channels to have the common substructure of $2^{m-1}$ input channels; $2^{m-2}$ output channels to have the common substructure of $2^{m-2}$ input channels; and so on. Because of the structuring, the total number of weights that must be calculated will be approximately proportional to $N^2$. A further discussion of the number of arithmetic operations is given below.

The following algorithm sequentially generates structures which can be implemented in a numerically efficient manner:

| STEP 1 | Generate root structure: $[X_1, X_2, \ldots, X_{2^m}]$. |
|---|---|
| STEP 2 | Generate a structure which is the inverted order of root structure: $[X_{2^m}, \ldots, X_1]$. |
| STEP 3 | Generate 2 structures from the preceding 2 structures which have the first $2^{m-1}$ elements of the preceding structures in inverted order. All other elements remain the same. |
| STEP 4 | Generate 4 structures from the preceding 4 structures which have the first $2^{m-2}$ elements of the preceding |

| | |
|---|---|
| STEP k | Generate $2^{k-2}$ structures from the preceding $2^{k-2}$ structures which have the first $2^{m-k+2}$ elements of the elements remain the same. |
| ⋮ | |
| STEP m + 1 | Generate $2^m - I$ structures from the preceding $2^{m-1}$ structures which have the first 2 elements of the preceding structures in inverted order. All other elements remain the same. |

For example, if $N=2^3$ (where $m=3$), the following structures would be generated sequentially by using the above procedure:

| | |
|---|---|
| STEP 1 | $[X_1,X_2,X_3,X_4,X_5,X_6,X_7,X_8] = Ch_1$ |
| STEP 2 | $[X_8,X_7,X_6,X_5,X_4,X_3,X_2,X_1] = Ch_8$ |
| STEP 3 | $[X_4,X_3,X_2,X_1,X_5,X_6,X_7,X_8] = Ch_4$ |
| | $[X_5,X_6,X_7,X_8,X_4,X_3,X_2,X_1] = Ch_5$ |
| STEP 4 | $[X_2,X_1,X_3,X_4,X_5,X_6,X_7,X_8] = Ch_2$ |
| | $[X_7,X_8,X_6,X_5,X_4,X_3,X_2,X_1] = Ch_7$ |
| | $[X_3,X_4,X_2,X_1,X_5,X_6,X_7,X_8] = Ch_3$ |
| | $[X_6,X_5,X_7,X_8,X_4,X_3,X_2,X_1] = Ch_6$ |

Note that channels 1, 2, 3, 4 have the substructure associated with $X_5$, $X_6$, $X_7$, $X_8$ and that channels 5, 6, 7, 8 have the substructure associated with $X_4$, $X_3$, $X_2$, $X_1$. Also note that $Ch_1$ and $Ch_2$ have the same 6-element substructures as do the channel pairs: ($Ch_4$, $Ch_3$), ($Ch_8$, $Ch_7$), and ($Ch_5$, $Ch_6$). A complete realization of the 8 output channels is illustrated in FIg. 4.

Figure 1:
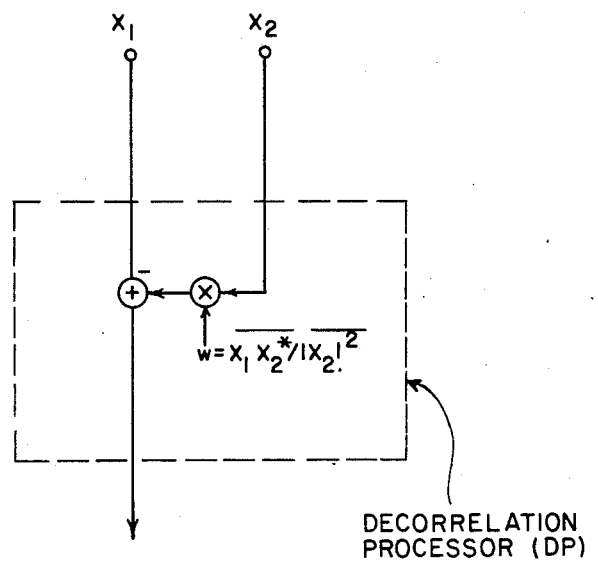
FIG. 1 is a schematic drawing of a decorrelation processor (DP).
Figure 4:
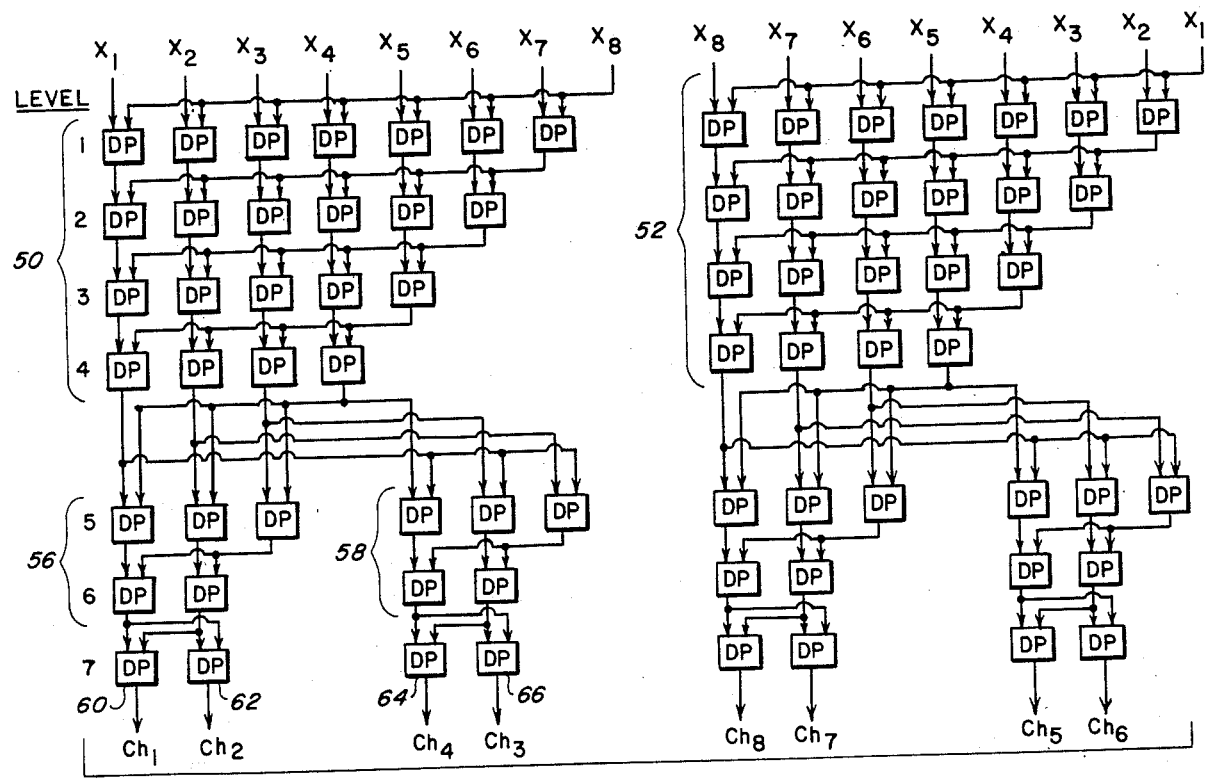
FIG. 4 is a schematic drawing of an 8-channel Fast Orthogonalization Network.

In the operation of the invention, as depicted in FIG. 4, inputs $X_1$ to $X_8$, and inputs $X_8$ to $X_1$ are fed into structures 50 and 52, respectively. Inputs $X_1$ to $X_7$ are first individually decorrelated with respect to input $X_8$ in structure 50 and inputs $X_8$ to $X_2$ are decorrelated individually with respect to input $X_1$. The decorrelation of an input with respect to another input uses the prior art DP (see FIG. 1) and decorrelates one input per level from the other inputs at that level. For instance, in level 1 of structure 50, inputs $X_1$ to $X_7$ are decorrelated with respect to input $X_8$. The outputs from the DPs of level 1 are the individual inputs $X_1$ to $X_7$ decorrelated with respect to $X_8$. The outputs from level 1 are then used as inputs into for level 2. In level 2 of structure 50 inputs $X_1$ to $X_6$ which are now decorrelated with respect to input $X_8$, are then additionally decorrelated with respect to $X_7$, which has been decorrelated with respect to $X_8$ in level 1. In level 3 of structure 50, inputs $X_1$ to $X_5$ are additionally decorrelated to $X_6$. The inputs into level 3 are the outputs of level 2. In level 4 of structure 50, inputs $X_1$ to $X_4$ are decorrelated with respect to input $X_5$. The inputs into level 4 are the outputs of level 3.

After level 4, structure 50 divides into structures 56 and 58. This is because channels $Ch_1$ and $Ch_2$ have no further common inputs with channels $Ch_3$ and $Ch_4$ or vice versa, so no further redundancy in the decorrelation circuit between these 4 channels exists that can be used to minimize the circuit. Structure 56 of level 5 is a continuation of the previous shrinking structure and is input $X_1$ to $X_3$ decorrelated with respect to $X_4$. The inputs of structure 56 of level 5 consists of the outputs of level 4.

Structure 58, level 5, is arranged so that inputs $X_4$ to $X_2$ are decorrelated with respect to $X_1$. Structure 58, level 5, is the reverse order of structure 56. The inputs of structure 58, level 5 are the outputs of level 4. Level 5 of structure 58 is created the same way as level 1 of structures 50 and 52 is created. The structure 52, level 1, is the reverse of the structure 50, level 1. It should be noted that the invention is partially orthogonalizing the common inputs, then from the level of the partial orthogonalization, splitting off two substructures where 1 substructure is a continuation of the previous structure with respect to design, and the 2nd substructure is a continuation of the previous substructure but with the input order inverted with respect to the first split off substructure. This process is repeated until one channel remains which is decorrelated with respect to all the other channels, i.e., inputs. In the case of structures 50 and 52, level 1, there are no common inputs to partially orthogonalize or decorrelate out, so only the splitting off and inverting of the substructure occurs in the initial design of the overall structure.

Continuing with the description of structure 50, level 6 of structure 56 is comprised of channels $X_1$ and $X_2$ and is decorrelated with respect to input $X_3$. Similarly structure 58, level 6 is comprised of channels $X_4$ and $X_3$ and is decorrelated with respect to $X_2$. At level 6 no further common inputs to $Ch_1$ and $Ch_2$ exist or to $Ch_4$ and $Ch_3$. The above mentioned procedure is then applied to obtain the structure 60. Structure 60 (1 DP) consists of inputs $X_1$ and $X_2$, $X_1$ being decorrelated with respect to $X_2$. Structure 62 consists of the inverse of its dual substructure (60) and consists of inputs $X_2$ and $X_1$, $X_2$ being decorrelated with respect to $X_1$. (The same is true with structure 64 and 66 with respect to inputs $X_4$ and $X_3$.) Partial orthogonalization is applied to these new split-off structures to obtain decorrelated channels $Ch_1$, $Ch_2$, $Ch_3$ and $C_4$. This last partial orthogonilization involved only 1 level, while previous partial orthogonalizations involved levels 5 and 6, and levels 1 to 4. Note how the repetition of the structure and the partial orthogonalizations occur in levels of powers of 2. (All that was discussed with respect to structure 50 and its substructures is applicable to structure 52 and its substructure with its corresponding channels and inputs).

Each two input decorrelation processor (DP) of the Fast Orthogonalization Network (FON) as depicted in FIG. 4 will have a complex weight associated with it. The number of DPs or complex weights associated with a FON can be found by considering the number of DPs at each level of the network. From FIG. 4 we see that the number of levels equals $N=1$. If $L_k$ is equal to the number of DPs at each level, then it can be shown that $$L_1 = 2^{m+1} - 2 \cdot 1$$

$$L_2 = 2^{m+1} - 2 \cdot 2$$

$$L_3 = 2^{m+1} - 2 \cdot 3$$

$$L_{2^m} - 1 = 2^{m+1} - 2 \cdot 2^{m-1}$$

$$L_{2^m} - 1_{+1} = 2^{m+1} - 2^2 \cdot 1$$

$$L_{2^m} - 1_{+2} = 2^{m+1} - 2^2 \cdot 2$$

-continued $$L_{2^m-1} + 2^m - 2 = 2^{m+1} - 2^2 \cdot 2^{m-2}$$

.
.
.

$$L_{2^m-1} = 2^{m+1} - 2^m \cdot 1.$$

Thus, the total number of DPs, $N_{DP}$, needed for a FON is derived by adding the right-hand sides of the above system of equations. It can be shown that $$N_{DP} = 1.5N(N-1) - 0.5N \log_2 N.$$

The above number is also equal to the total number of complex weights associated with a FON.

Obviously, numberous (additional) modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A fast orthogonalization network for orthogonalizing N inputs with respect to each other, where $N = 2^m$ and $m = 2$, said network comprising:

first means responsive to a root structure of the N inputs in input order 1 to N for partially orthogonalizing said root structure inputs with respect to their common inputs so that the 1 to $2^{m-1}$ inputs are decorrelated with respect to inputs $2^{m-1}$ to $2^m$;

second means responsive to an inverted root structure of the N inputs in input order N to 1 for partially orthogonalizing said inverted root structure inputs with respect to their common inputs so the $2^m$ to $2^{m-1}+1$ inputs are decorrelated with respect to inputs 1 to $2^{m-1}$;

third means responsive to a first root substructure of inputs 1 to $2^{m-1}$ from said first means for orthogonalizing said first root substructure so input 1 is decorrelated with respect to input $2^{m-1}$;

fourth means responsive to a second root substructure of inputs 1 to $2^{m-1}$ from said first means for orthogonalizing said second root substructure so input $2^{m-1}$ is decorrelated with respect to input 1;

fifth means responsive to a first inverted root substructure of inputs $2^m$ to $2^{m-1}+1$ from said second means for orthogonalizing said first inverted root substructure so input $2^m$ is decorrelated with respect to $2^{m-1}+1$; and sixth means responsive to a second inverted root substructure of inputs $2^m$ to $2^{m-1}+1$ from said second means for orthogonalizing said second inverted root substructure so input $2^{m-1}+1$ is decorrelated with respect to input $2^m$.

2. The fast orthogonalization network of claim 1 wherein:

each of said first and second means is comprised of $2^{m-1}$ levels of decorrelation processors (DP's), with the level receiving said root structure inputs and said inverted root structure inputs having $2^m-1$ DP's, each DP being connected to a unique input and the highest order input, all subsequent levels of DP's in each of said first and second means having 1 DP less than the preceding level; each level of DP's having outputs, the number of outputs equal to the number of DP's in that level, each DP of each subsequent level of DP's after the level receiving said root structure inputs and said inverted root structure inputs receiving a unique input from the preceding level of DP's, along with the highest order input at each level if said highest order input is a root of said root structure, or the lowest order input at each level if said lowest order input is an inverted root of said inverted root substructure.

3. A method for orthogonalizing N data inputs to a fast orthogonalization network with respect to each other, where $2^{m-1} < N \leq 2^m$ and m is an integer $\geq 1$, said method comprising the steps of:

a. arranging the N data inputs to the fast orthogonalization network into a first group having a data input order of 1 to N;

b. arranging the N data inputs to the fast orthogonalization network into a second group having a data input order of N to 1;

c. partially orthogonalizing in a first decorrelation circuit of the fast orthogonalization network the N data inputs in said first group to remove data inputs common to the first $2^{m-I}$ inputs in said first group, where $I = 1$;

d. partially orthogonalizing in a second decorrelation circuit of the fast orthogonalization network the N data inputs in said second group to remove data inputs common to the first $2^{m-I}$ data inputs in said second group, where $I = 1$;

e. splitting off the partially orthogonalized N data inputs in said first group into a first subgroup having data input order 1 to $2^{m-I}$ and a second subgroup having data input order $2^{m-I}$ to 1, where $I = 1$;

f. splitting off the partially orthogonalized N data inputs in said second group into a third subgroup having data input order $2^m$ to $2^{m-I}$ and a fourth subgroup having data input order $2^{m-I}$ to $2^m$, where $I = 1$;

g. partially orthogonalizing the first through fourth subgroups in associated respective third, fourth, fifth and sixth decorrelation circuits of the fast orthogonalization network to remove data inputs common to their first $2^{m-I}$ data inputs, where I equals 2; and h. repeating steps e, f and g until only one data input remains, where for each repetition the subgroups that are split off are treated as a new first group and a new second group, and the value identified for I in each of steps e, f and g is increased by 1.

4. A fast orthogonalization network for orthogonalizing inputs 1, 2, 3 and 4 with respect to each other, said network comprising:

first means selectively responsive to the inputs 1, 2, 3 and 4 for partially decorrelating the inputs 1 and 2 with respect to the inputs 3 and 4;

second means selectively responsive to the inputs 1, 2, 3 and 4 for partially decorrelating the inputs 3 and 4 with respect to the inputs 1 and 2;

third means responsive to the partially decorrelated inputs 1 and 2 from said first means for decorrelating input 1 with respect to input 2;

fourth means responsive to the partially decorrelated inputs 1 and 2 from said first means for decorrelating input 2 with respect to input 1;

fifth means responsive to the partially decorrelated inputs 3 and 4 from said second means for decorrelating input 3 with respect to input 4; and sixth means responsive to the partially decorrelated inputs 3 and 4 from said second means for decorrelating the input 4 with respect to the input 3.

5. A fast orthogonalization network for orthogonalizing inputs 1, 2, 3, 4, 5, 6, 7 and 8 with respect to each other, said network comprising:

first means selectively responsive to the inputs 1 through 8 for partially decorrelating the inputs 1 through 4 with respect to the inputs 5 through 8;

second means selectively responsive to the inputs 1 through 8 for partially decorrelating the inputs 5 through 8 with respect to the inputs 1 through 4;

third means selectively responsive to the partially decorrelated inputs 1 through 4 from said first means for partially decorrelating the partially decorrelated inputs 1 and 2 with respect to the partially decorrelated inputs 3 and 4;

fourth means selectively responsive to the partially decorrelated inputs 1 through 4 from said first means for partially decorrelating the partially decorrelated inputs 3 and 4 with respect to the partially decorrelated inputs 1 and 2;

fifth means selectively responsive to the partially decorrelated inputs 5 through 8 from said second means for partially decorrelating the partially decorrelated inputs 5 and 6 with respect to the partially decorrelated inputs 7 and 8;

sixth means selectively responsive to the partially decorrelated inputs 5 through 8 from said second means for partially decorrelating the partially decorrelated inputs 7 and 8 with respect to the partially decorrelated inputs 5 and 6;

seventh means responsive to the partially decorrelated inputs 1 and 2 from said third means for decorrelating input 1 with respect to input 2;

eighth means responsive to the partially decorrelated inputs 1 and 2 from said third means for decorrelating input 2 with respect to input 1;

ninth means responsive to the partially decorrelated inputs 3 and 4 from said fourth means for decorrelating input 3 with respect to input 4;

tenth means responsive to the partially decorrelated inputs 3 and 4 from said fourth means for decorrelating input 4 with respect to input 3;

eleventh means responsive to the partially decorrelated inputs 5 and 65 from said fifth means for decorrelating input 5 with respect to input 6;

twelfth means responsive to the partially decorrelated inputs 5 and 6 from said fifth means for decorrelating input 6 with respect to input 5;

thirteenth means responsive to the partially decorrelated inputs 7 and 8 from said sixth means for decorrelating input 7 with respect to input 8; and fourteenth means responsive to the partially decorrelated inputs 7 and 8 from said sixth means for decorrelating input 8 with respect to input 7.

* * * * *